(12) United States Patent
Fan et al.

(10) Patent No.: US 11,675,274 B2
(45) Date of Patent: Jun. 13, 2023

(54) ETCH BIAS CHARACTERIZATION AND METHOD OF USING THE SAME

(71) Applicant: ASML NETHERLANDS B.V., Veldhoven (NL)

(72) Inventors: Yongfa Fan, Sunnyvale, CA (US); Leiwu Zheng, San Jose, CA (US); Mu Feng, San Jose, CA (US); Qian Zhao, San Jose, CA (US); Jen-Shiang Wang, Sunnyvale, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 578 days.

(21) Appl. No.: 16/484,582

(22) PCT Filed: Feb. 21, 2018

(86) PCT No.: PCT/EP2018/054212
§ 371 (c)(1),
(2) Date: Aug. 8, 2019

(87) PCT Pub. No.: WO2018/153884
PCT Pub. Date: Aug. 30, 2018

(65) Prior Publication Data
US 2019/0354020 A1 Nov. 21, 2019

Related U.S. Application Data

(60) Provisional application No. 62/463,556, filed on Feb. 24, 2017.

(51) Int. Cl.
*G03F 7/20* (2006.01)
*G03F 7/00* (2006.01)
(Continued)

(52) U.S. Cl.
CPC ............... *G03F 7/705* (2013.01); *G03F 1/80* (2013.01); *G03F 7/70625* (2013.01); *H01L 22/34* (2013.01)

(58) Field of Classification Search
CPC .............. G03F 7/705; G03F 7/70625; G03F 7/70483–70541; G03F 7/70608–70683;
(Continued)

(56) References Cited

U.S. PATENT DOCUMENTS

| 5,926,690 A | 7/1999 | Toprac et al. |
| 2005/0221619 A1* | 10/2005 | Yue .................. H01L 21/31144 438/714 |

(Continued)

FOREIGN PATENT DOCUMENTS

KR 1020079005921 1/2007

OTHER PUBLICATIONS

Korean Office Action issued in corresponding Korean Patent Application No. KR10-2021-7015472, dated Jun. 7, 2021.
(Continued)

*Primary Examiner* — Christina A Riddle
(74) *Attorney, Agent, or Firm* — Pillsbury Winthrop Shaw Pittman LLP

(57) ABSTRACT

A method involving determining an etch bias for a pattern to be etched using an etch step of a patterning process based on an etch bias model, the etch bias model including a formula having a variable associated with a spatial property of the pattern or with an etch plasma species concentration of the etch step, and including a mathematical term including a natural exponential function to the power of a parameter that is fitted or based on an etch time of the etch step; and adjusting the patterning process based on the determined etch bias.

20 Claims, 9 Drawing Sheets

(51) Int. Cl.
  *G03F 1/80* (2012.01)
  *H01L 21/66* (2006.01)
(58) Field of Classification Search
  CPC ..... G03F 1/80; G03F 1/36; G03F 1/68; G03F 1/70; G03F 1/72; G03F 1/82; G03F 1/84; H01L 22/12; H01L 22/20; H01L 22/34; H01L 21/3065; H01L 21/31144
  USPC ....... 355/18, 30, 52–55, 67–71, 72–77, 133; 438/714, 706–712, 734, 739; 703/2; 430/22, 30
  See application file for complete search history.

(56) References Cited

U.S. PATENT DOCUMENTS

| | | |
|---|---|---|
| 2007/0143733 A1 | 6/2007 | Zach et al. |
| 2011/0138343 A1* | 6/2011 | Granik .................. G03F 7/705 716/54 |
| 2011/0314431 A1* | 12/2011 | Kim .......................... G03F 1/80 716/53 |
| 2015/0261896 A1* | 9/2015 | Smith .................. G03F 7/0392 703/2 |
| 2016/0335384 A1 | 11/2016 | Song et al. |

OTHER PUBLICATIONS

International Search Report and Written Opinion issued in corresponding PCT Patent Application No. PCT/EP2018/054212, dated Jun. 6, 2018.
Wu, Cheng-En, et al.: "Photoresist 3D profile related etch process simulation and its application to full chip etch compact modeling", Proc. of SPIE, vol. 9426, Mar. 18, 2015.

* cited by examiner

ETCH BIAS CHARACTERIZATION AND METHOD OF USING THE SAME

CROSS-REFERENCE TO RELATED APPLICATIONS

This application is the U.S. national phase entry of PCT Patent Application No. PCT/EP2018/054212, filed on Feb. 21, 2018, which is based upon and claims the benefit of priority of U.S. Provisional Application No. 62/463,556, filed Feb. 24, 2017, and entitled "Etch Bias Characterization and Method of Using the Same," the disclosure of which is incorporated herein in its entirety by reference.

FIELD

The invention relates generally to device manufacturing and methods of configuring and evaluating device manufacturing processes.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a pattern corresponding to an individual layer of the IC, and this pattern can be imaged onto a target portion (e.g. comprising part of, one or several dies) on a substrate (e.g. a silicon wafer) that has a layer of radiation-sensitive material (resist such as photoresist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc. While the term substrate encompasses an underlying base (e.g., silicon), it can also, where applicable, encompass one or more layers overlying the base. Thus, transferring a pattern into or onto the substrate can include transfer of the pattern onto one or more layers on the substrate.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

Etch bias of patterning processes may cause deviation of a device pattern from a set of target dimensions of the device pattern. Determining etch bias may be computationally complex because of, e.g., the complexity of the device pattern, the scale of the device pattern, the chemical processes that may occur in an etch process that transfers a device pattern from a layer of patterning material to a substrate, and/or a coating, transient or otherwise, that may form on sidewalls of a substrate as a device pattern is etched into the device pattern.

Thus, there is provided one or more methods of determining a change in a device pattern dimension during an etch process that transfers a device pattern in a layer on a substrate to the substrate.

Aspects of the present disclosure relate to collecting a set of values for one or more spatial properties of a device pattern, such as one or more dimensions, one or more positions of a part (e.g., an edge) of a device pattern, etc., at a plurality of sites of a device formed by etching, using a computing device to fit a mathematical model having a set of one or more fitting parameters to the set of spatial properties, calculating, based on the parameterized model, an etch bias for the device pattern at at least one location thereof for an etch process, wherein the model comprises a formula that includes a variable associated with a spatial property of the device pattern at the location and/or a plasma species concentration, and a mathematical term associated with a natural exponential function to the power of a parameter that is based on (e.g., a function) of etch time for the etch process, and adjusting a patterning process based on the calculated etch bias (e.g., adjusting a border of a region of a patterning device used to form the device pattern as part of the patterning process).

In an embodiment, there is provided a method, comprising: determining, by a hardware computer, an etch bias for a pattern to be etched using an etch step of a patterning process based on an etch bias model, the etch bias model comprising a formula including a variable associated with a spatial property of the pattern or with an etch plasma species concentration of the etch step, and including a mathematical term comprising a natural exponential function to the power of a parameter that is fitted or based on an etch time of the etch step; and adjusting the patterning process based on the determined etch bias.

In an embodiment, there is provided a method, comprising: determining, by a hardware computer, an etch bias for a pattern to be etched using an etch step of a patterning process based on an etch bias model, the etch bias model comprising a function of an etch plasma species concentration and a patterning material concentration; and adjusting the patterning process based on the determined etch bias.

In an embodiment, there is provided a computer program product comprising a non-transitory computer readable medium having instructions recorded thereon, the instructions when executed by a computer implementing a method as described herein.

These and other features of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise. In addition, as used in the specification and the claims, the term "or" means "and/or" unless the context clearly dictates otherwise.

BRIEF DESCRIPTION OF THE DRAWINGS

The invention is illustrated by way of example, and not by way of limitation, in the figures of the accompanying drawing and in which like reference numerals refer to similar elements.

DETAILED DESCRIPTION

Figure 1:
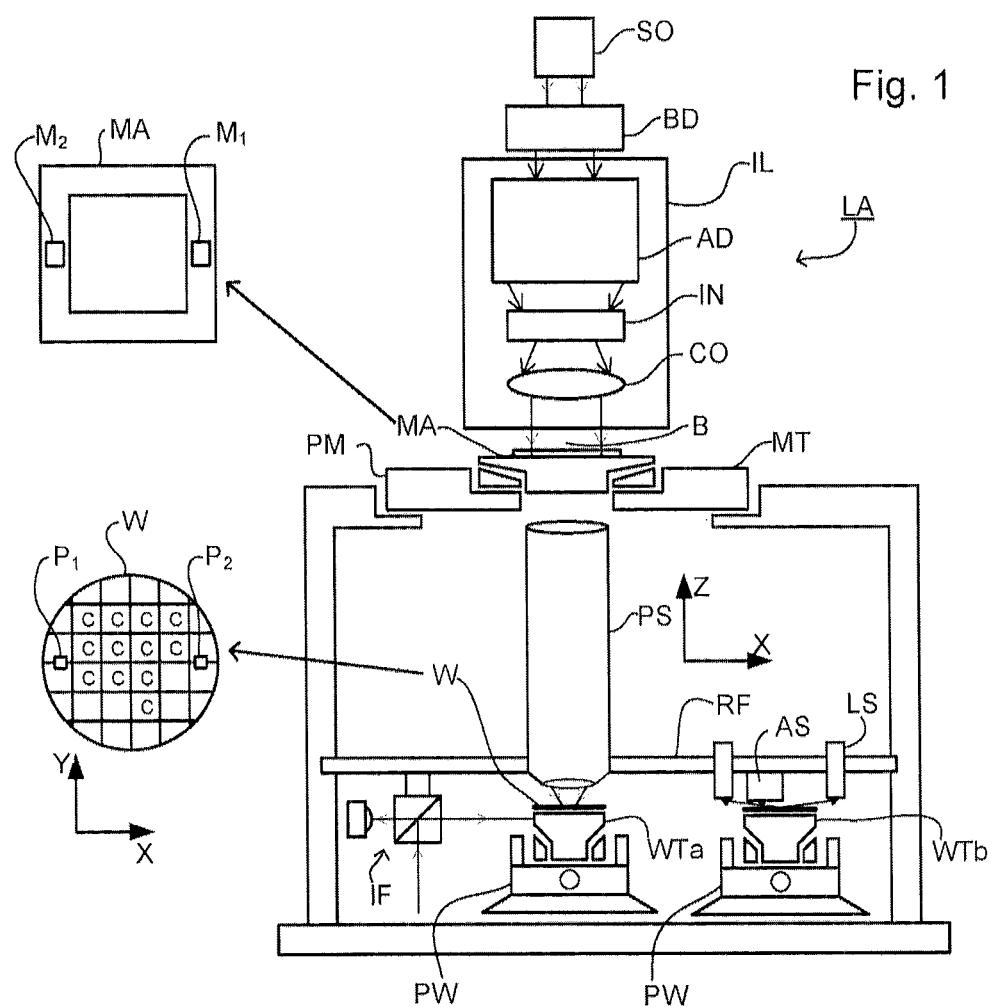
FIG. 1 depicts a schematic diagram of an embodiment of a lithographic apparatus.

FIG. 1 schematically depicts a lithographic apparatus LA in association with which the techniques described herein can be utilized. The apparatus includes an illumination optical system (illuminator) IL configured to condition a radiation beam B (e.g., ultraviolet (UV), deep ultraviolet (DUV) or extreme ultraviolet (EUV) radiation), a patterning device support or support structure (e.g., a mask table) MT constructed to support a patterning device (e.g., a mask) MA and connected to a first positioner PM configured to accurately position the patterning device in accordance with certain parameters; one or more substrate tables (e.g., a wafer table) WTa, WTb constructed to hold a substrate (e.g., a resist coated wafer) W and connected to a second positioner PW configured to accurately position the substrate in accordance with certain parameters; and a projection optical system (e.g., a refractive, reflective, catoptric or catadioptric optical system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation. In this particular case, the illumination system also comprises a radiation source SO.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix. As another example the patterning device comprises a LCD matrix.

As here depicted, the apparatus is of a transmissive type (e.g., employing a transmissive patterning device). However, the apparatus may be of a reflective type (e.g., employing a programmable minor array of a type as referred to above, or employing a reflective mask (e.g., for an EUV system)).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO (e.g., a mercury lamp or excimer laser, LPP (laser produced plasma) EUV source). The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the spatial and/or angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS, measuring the position of alignment markers on the substrate using an alignment sensor AS, performing any other type of metrology or inspection, etc. This enables a substantial increase in the throughput of the apparatus. More generally, the lithography apparatus may be of a type having two or more tables (e.g., two or more substrate tables, a substrate table and a measurement table, two or more patterning device tables, etc.). In such "multiple stage" devices a plurality of the multiple tables may be used in parallel, or preparatory steps may be carried out on one or more tables while one or more other tables are being used for exposures.

While a level sensor LS and an alignment sensor AS are shown adjacent substrate table WTb, it will be appreciated that, additionally or alternatively, a level sensor LS and an alignment sensor AS can be provided adjacent the projection system PS to measure in relation to substrate table WTa.

The depicted apparatus can be used in a variety of modes, including for example a step mode or a scan mode. The construction and operation of lithographic apparatus is well known to those skilled in the art and need not be described further for an understanding of embodiments of the present invention.

Figure 2:
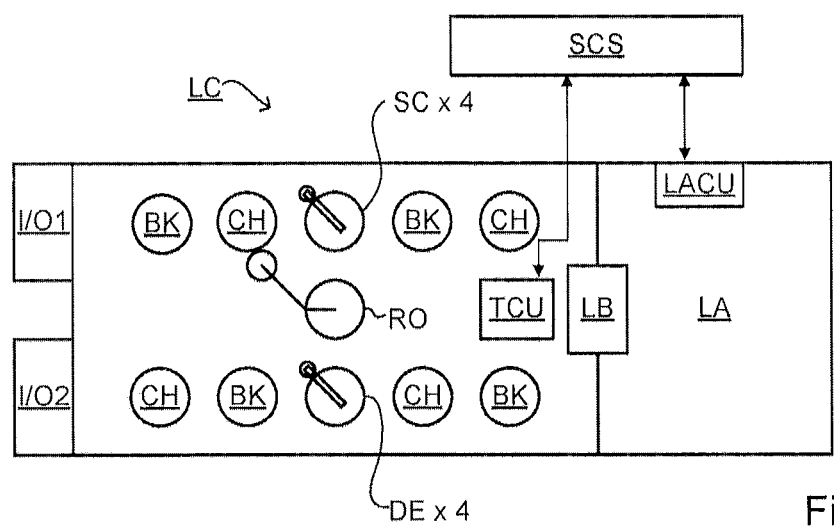
FIG. 2 depicts a schematic diagram of an embodiment of a lithographic cell.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In an embodiment of a patterning process, a device pattern may be transferred from a patterning device into a layer of patterning material (e.g., resist) on a substrate (e.g., a semiconductor substrate). A device pattern in a layer of patterning material may be transferred to material under the patterning material by a pattern transfer process. In an embodiment, the device pattern may be transferred to a substrate by a substrate material removal process such as etching. In an embodiment, the etching comprises plasma etching. In an embodiment, plasma etching involves creation of ionized and non-ionized chemical species in a low-pressure environment adjacent to a surface of a substrate. Plasma etching may involve accelerating some chemical species onto a surface of the substrate in order to promote removal of substrate material. Chemical bonds between atoms of a substrate may be weakened by a chemical reaction of some of the atoms to chemical species originating in the plasma. Removal of substrate material atoms during an etching process may be enhanced by transfer of kinetic energy to substrate material by plasma species that accelerate toward the substrate material and strike the substrate material, promoting vibrational motion of substrate atoms with respect to neighboring substrate material atoms and with respect to atoms and/or molecules originating from the plasma. Atoms of substrate material may be chemically bonded to atoms/molecules that originate in an etching plasma after vibrational energy transferred to the substrate material breaks one or more bonds between substrate material atoms, while bonds between a plasma species and a liberated substrate material atom remain. In an embodiment, an etch rate may depend on a density of plasma above a pattern element used as a masking template. In an embodiment, an etch rate may also depend on a temperature of substrate material and a kinetic energy of plasma species that may accelerate to strike the substrate. For purposes of clarity, this application discusses embodiments involving a plasma etch (or a reactive ion etch) process, although other means of generating device features are also envisioned.

Dimensions of pattern elements (corresponding to etched device features), or between pattern elements, of the device pattern may change during such a pattern transfer process and accordingly result in change in a dimension of the one or more associated device features. In particular, such change in dimensions may occur in a direction essentially parallel to the major plane of the substrate. In the context of an etch process that involves removal of material, this may be referred to as 2-dimensional (2D) etch bias. It is the lateral etching of a device feature while a vertical dimension of the device feature is established, during the substrate material removal.

But, unanticipated or undesired etch bias may result in a device with performance parameters outside of specification. For example, dimensions of a device may be relevant to the function of the device. Variance in device feature dimensions may modify electrical parameters of the device. Some parameters of an electronic device may be sensitive to device dimensions including resistance and/or parasitic capacitance of conductive lines, and/or timing of gate switching according to a gate length of transistors in the device. Dielectric breakdown of an insulating material in an integrated circuit may also be a function of the dimension of an insulating material. So, preserving a dimension of, or between, device features of a device may help ensure or preserve functionality of the device within predetermined specifications.

Now, etch bias may vary on a substrate created by a patterning process. For example, etch bias may vary according to the density of a device pattern being formed on a substrate. That is, etch bias may be different in a dense region than in an isolated regions of a resist pattern. Additionally or alternatively, etch bias may be different at different locations of a substrate irrespective of density. For example, the etch bias may be different at a central portion of the substrate than at or near an edge of the substrate.

Mathematically modeling etch bias may improve creation of the final device feature dimensions. The results of such modeling can be used for various purposes. For example, the results can be used to adjust the patterning process in terms of changing a design, controlling a parameter, etc. For example, the results can be used to adjust one or more spatial properties of one or more elements in a pattern provided by the patterning device, wherein the patterning device pattern is used to create the device pattern that will be used for etching on the substrate. Thus, once the adjusted patterning device pattern is transferred to the substrate, the device pattern on the substrate is effectively adjusted, before etching, in order to compensate for etch bias that is expected to occur during etching. As another example, one or more adjustments can be made to the lithographic apparatus in terms of adjustment of dose, focus, etc. As will be appreciated, there can be many more applications. Thus, compensating for etch bias may result in a device with more one or more uniform feature sizes, one or more uniform electrical properties, and/or one or more improved (e.g., closer to a desired result) performance characteristics.

Moreover, etch bias, while sometimes detrimental to the manufacturing of devices on substrate, may sometimes be used in order to generate desirable structures on a substrate. By accounting for a degree of etch bias when making a patterning device, it may be possible to manufacture device features in a device on the substrate with dimensions that are smaller than the optical resolution limits of a pattern transfer process from the patterning device to the substrate. So, in this respect, such modeled results of etch bias can be used to adjust the patterning process in terms of changing a design, controlling a parameter, etc.

So, modeling etch bias in an etch process can help to generate more accurate device features by, for example, compensating for etch bias such as by tailoring the patterning device to anticipate (correctly) what the etch bias of an etch process may be (e.g., as a function of pattern density), so that the actual features generated by an etch process after (adjusted) lithography may be closer to a desired product specification.

But, modeling etch bias can be a time-consuming, empirical task. It can also be inaccurate. For example, modeling etch bias may be complex when performed at a full device pattern level (e.g., full chip level) because of the large number of features that are modeled Accordingly, there is provided techniques here than quickly and accurately model etch bias to enable, for example, full chip analysis of patterning device patterns.

The present disclosure includes a description of a theoretical framework for performing modeling of 2D etch bias that may be used in the process of making a patterning device for manufacturing a device. While the discussion herein focuses on etch and etch bias, the principles of the techniques can apply to other pattern transfer processes that transfer a pattern in a layer into the substrate.

Etch bias may be measured on a substrate after an etch process is performed. Etch bias may be a difference between a position of a portion of the side of a pattern element of a patterning layer (the pattern element corresponding to the device feature) prior to etch and the position of the corresponding portion of the side of the pattern element after etch. Similarly, etch bias may be a difference between a position of a portion of the side of a device feature (the device feature corresponding to a pattern element) prior to etch and the position of the corresponding portion of the side of the device feature after etch. Etch bias may occur at an interface between an etched region of a substrate and an unetched region of the substrate. In etch bias, an actual dimension or critical dimension (CD) of a device feature or device pattern element corresponding to the device feature may differ from an anticipated or critical dimension of the device feature or pattern element ($CD_0$) after etch. In embodiment, the etch bias can be defined at multiple locations on a device feature. A trench may have etch bias at both sides of the trench, and a via may have etch bias at both sides of the via. A line, such as for a finFET, may have etch bias on both sides, making the final line dimension smaller than the pattern feature that masks the line during an etch process.

Etch bias may be sensitive to various conditions. For example, as discussed above, etch bias can be sensitive to local pattern density in a device pattern. Additionally or alternatively, etch bias may be sensitive to chemistry conditions in the etching plasma, and/or to the temperature of the substrate and/or plasma during the etching process.

Figure 3:
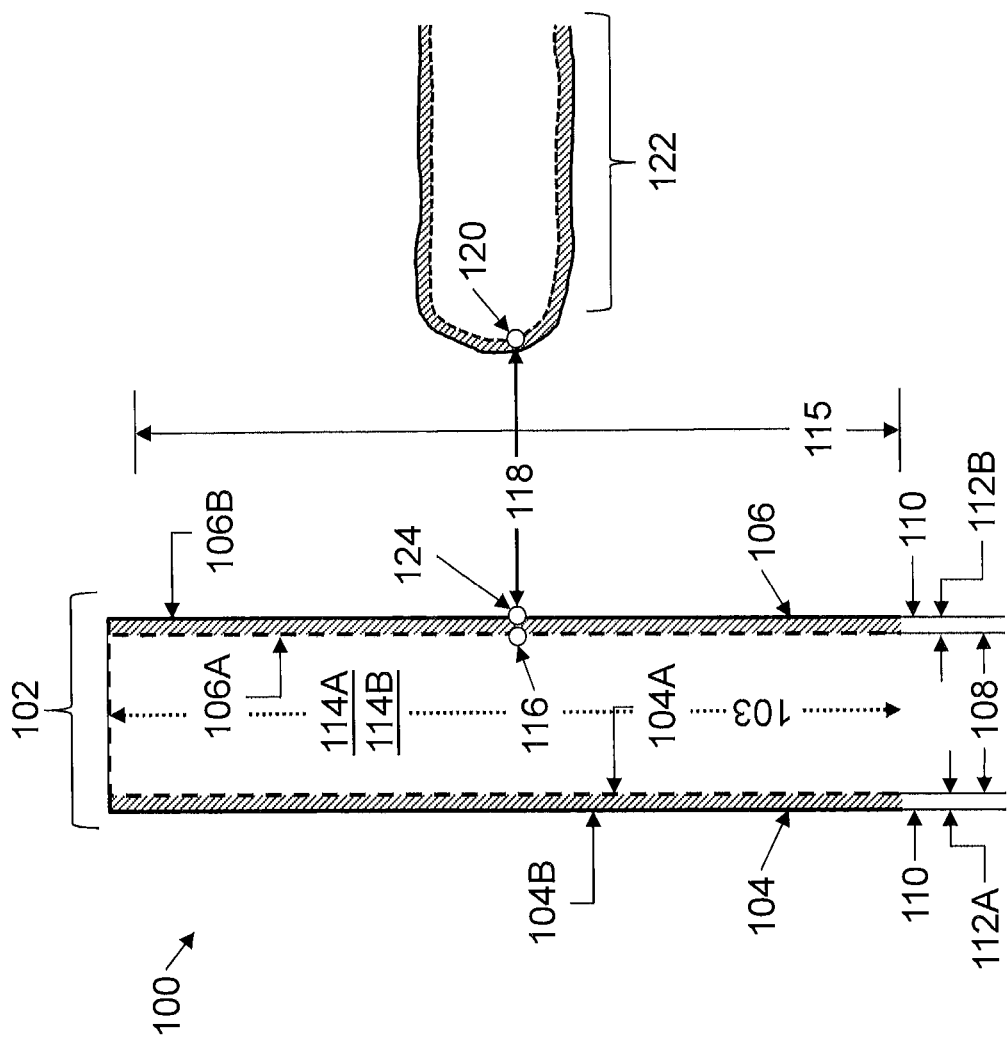
FIG. 3 depicts a schematic diagram of an embodiment of a modeled area of a device.

FIG. 3 depicts a schematic diagram of an embodiment of a modeled area 100 of a device pattern. Modeled area 100 may include device pattern elements that correspond to etched device features that extend above a major surface of a substrate and/or that are recessed into a substrate. Examples of recessed device features may include trenches, vias, and/or pad openings. Examples of protruding device features may include lines for gates and/or finFETs, or masking lines compatible with double patterning lithography scenarios.

In an embodiment, pattern element 102 may be a trench in a patterning layer (e.g., resist layer), or may be a line of patterning layer that extends above a top surface of a substrate. While the discussion herein will focus on one or more pattern elements in a patterning layer, the discussion herein could also be viewed in terms of the one or more etched device features just as they are being formed as well as after they are formed.

Pattern element 102 may have a centerline 103 located between a first side 104 and a second side 106 of the pattern element. In an embodiment where pattern element 102 is a trench, pattern element 102 may have a first dimension 108 between first side 104 and second side 106, the dimension 108 corresponding to a dimension of a pattern element at the start of an etch process to form one or more device features by etching in the substrate using pattern element 102. Pattern element 102 may have a second dimension 110 between first side 104 and second side 106, the dimension 110 corresponding to a dimension of the pattern element after the one or more device features have been formed by etching using the pattern element 102. In an embodiment, if pattern element 102 is a trench, first dimension 108 may be smaller than second dimension 110.

According to an embodiment, first side 104 may have a first position 104A at a beginning of an etch process and a second position 104B at the end of the etch process, where first position 104A and second position 104B are different positions. Some characteristics of pattern element 102 described above, as pertaining to a trench, may similarly be ascribed to characteristics of a line that rises above a top surface of a substrate.

Pattern element 102 may have a first etch bias 112A at first side 104 and a second etch bias 112B at second side 106. The sum of first etch bias 112A and second etch bias 112B may be a dimension bias (or a critical dimension (CD) bias) of the pattern element that occurs during formation of the one or more associated device features. First etch bias 112A and second etch bias 112B may have different magnitudes or may be substantially the same. A difference between first etch bias 112A and second etch bias 112B may relate to a density of pattern elements near first side 104 and/or second side 106.

An etch bias may be positive, where a dimension of the pattern element is larger after etching than before etching, or negative, where the dimension is smaller after etching than before etching. In an embodiment, a line formed by an etch process may have a negative etch bias after etching when an etch process recesses a sidewall of the line laterally toward a central portion thereof during an etch process that forms the line. In an embodiment a trench formed by an etch process may have a positive etch bias after etching when the etch process recesses a sidewall of the line laterally away from a central portion of the trench.

In an embodiment, pattern element 102 may have an initial area 114A measured between first side 104 and second 106 at first positions 104A and 106A, respectively, and within a length 115 of the pattern element. In an embodiment, a final area 114B may be measured between second positions 104B and 106B, respectively. Initial area 114A may be smaller and/or larger than final area 114B according to an embodiment. Initial area 114A and final area 114B may be etched areas of a device feature, describing a recessed area into, or protruding area from, a substrate material.

Pattern element 102 may have an evaluation point 116 on a side of the pattern element. FIG. 3 shows evaluation point 116 on second side 106 at the first position 106A. After a certain amount of etch time and associated etch bias, the second side 106 may be located at evaluation point 124. So, the etch bias can be measured using measurements of one or more spatial properties in relation to evaluation point 116/124. As a simple example, a measurement at a measurement site may involve measuring a position of evaluation point 116 can be measured before etch and a position of evaluation point 124 can be measured after etch. As another example, the cross-wise dimension of pattern element 102 may be measured before etch and after etch. As a further example, a dimension 118 of a device pattern may be measured between pattern elements, such as between pattern element 102 and an evaluation point 120 on a second pattern element 122. So, an example measurement site in a device pattern may extend between evaluation points, such as evaluation point 116 and evaluation point 120. This dimension can be measured before etch and then after etch. A device pattern on a substrate may have a plurality of measurement sites (or locations) in the device pattern for measuring values of one or more spatial properties, including etch bias after etching a substrate having a device pattern thereon. A measured device pattern spatial property at a measurement site may be added to a set of values of one or more spatial properties of a device pattern for calculating etch bias. The etch bias calculation may be performed in a computing device in an automated process as part of a manufacturing process or a product development process.

Figure 4:
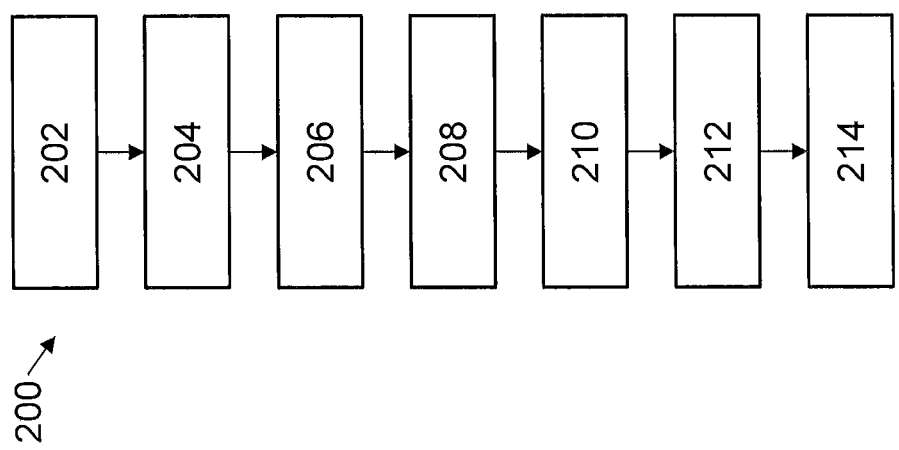
FIG. 4 depicts a flow diagram of an embodiment of a method for determining etch bias.

FIG. 4 depicts an example flow diagram of an embodiment of a method 200 for determining etch bias. In an operation 202, a plurality of sites in a device pattern may be selected in order to measure etch bias in the device pattern. Sites in the plurality of sites may include pattern elements corresponding to trenches, vias, pads, etc. In an embodiment, a measurement site in the plurality of sites may traverse a pattern element such as a trench opening. In an embodiment, a measurement site may traverse material that lies between two pattern elements, such as two trenches.

In an operation 204, a value of a first spatial property of the device pattern may be measured at a plurality of measurement sites in a device pattern. A first measurement of a device pattern may be performed after a device pattern is transferred from a patterning device to a layer of patterning material on a substrate. A patterning material, such as resist, may be patterned by exposing the patterning material to radiation energy incident thereon from the patterning device. A dose and/or focus of the radiation may be adjusted in order to tailor dimensions of the device pattern formed in the patterning material. Measurements may be recorded by optical, electrical, or other means suitable for probing one or more device pattern spatial properties on a substrate according to processes and methods familiar to those in the art. In an embodiment, the set of values of the first spatial property at the measurement sites is input in to a storage medium or memory of a computing device.

In an operation 206, substrate material (e.g., of the substrate base and/or of a layer overlying the substrate base) may be removed from the substrate using the device pattern in the patterning layer as a masking template, e.g., by an etch process. The substrate material removal may be a plasma etch process, a chemical etch process, or some other material removal process that transfers a device pattern from the layer of patterning material on the substrate into substrate material.

In an operation 208, a value of second spatial property of the device pattern may be measured after the substrate material removal process. Measurement of the second spatial property may be at a plurality of measurement sites at or near the plurality of measurement sites where the first spatial property was measured. In an embodiment, the set of values of the second spatial property at the measurement sites is input in to a storage medium or memory of a computing device.

In an operation 210, an etch bias may be calculated for the measurement sites of the plurality of sites where first and second measurements were recorded in operations 204 and 208, respectively. For example, a difference can be calculated between the applicable values of the first and second properties. Etch bias values for the measurement sites of the plurality of sites may be recorded in a data set and optionally stored in a computer device memory for subsequent analysis and processing. Other information of the device pattern on the substrate may be recorded in the data set, including the location of measurement sites, a shape of one or more pattern elements near to the measurement sites, and/or a dimension of one or more pattern elements separate from the applicable pattern element that may be used for etch bias calculations, in order to facilitate etch bias modeling.

In an operation 212, a mathematical model having a formula having one or more mathematical terms with one or more variables and one or more parameters is fitted to the etch bias, and/or other, data in the data set. In an embodiment, fitting the data set with the formula results in a calculated value of one or more formula fitting parameters. Further description of the one or more variables and one or more parameters will discussed further hereafter.

In an operation 214, the parameterized model of operation 212 is used to generate, for an etch process, one or more etch bias values for at least one location in a device pattern. The results of such modeling can be used for various purposes. For example, the results can be used to adjust the patterning process in terms of changing a design, controlling a parameter, etc.

As an example of application of the determined etch bias, the results can be used to adjust one or more dimensions of one or more elements in a pattern provided by the patterning device, wherein the patterning device pattern is used to create the device pattern that will be used for etching on the substrate. Thus, once the adjusted patterning device pattern is transferred to the substrate, the device pattern on the substrate is effectively adjusted, before etching, in order to compensate for etch bias that is expected to occur during etching. That is, in an embodiment, an offset for a dimension of a patterning device pattern feature is calculated based upon the determined etch bias to compensate for etch bias in an etch process. In an embodiment, an offset for a dimension of a patterning device pattern feature is calculated based upon the determined etch bias in order to adjust a dimension of a device pattern to match a feature dimension that is below an optical resolution of the patterning device used to generate the device pattern on a substrate.

As another example of application of the determined etch bias, one or more adjustments can be made to the lithographic apparatus in terms of adjustment of dose, focus, etc. As will be appreciated, there can be many more applications. Thus, compensating for etch bias may result in a device with more one or more uniform feature sizes, one or more uniform electrical properties, and/or one or more improved (e.g., closer to a desired result) performance characteristics.

Formulas for making predictions of etch bias may take various sophisticated forms. In an embodiment, an etch bias model may include a formula with a term related to a spatial property of a device pattern prior to etching. In an embodiment, an etch bias model may include a formula with a term related to a spatial property of a device pattern after an etch process is performed. In an embodiment, an etch bias model may include a formula with a term that relates to an area of patterning material surrounding a measuring site in the patterning device.

Figure 5:
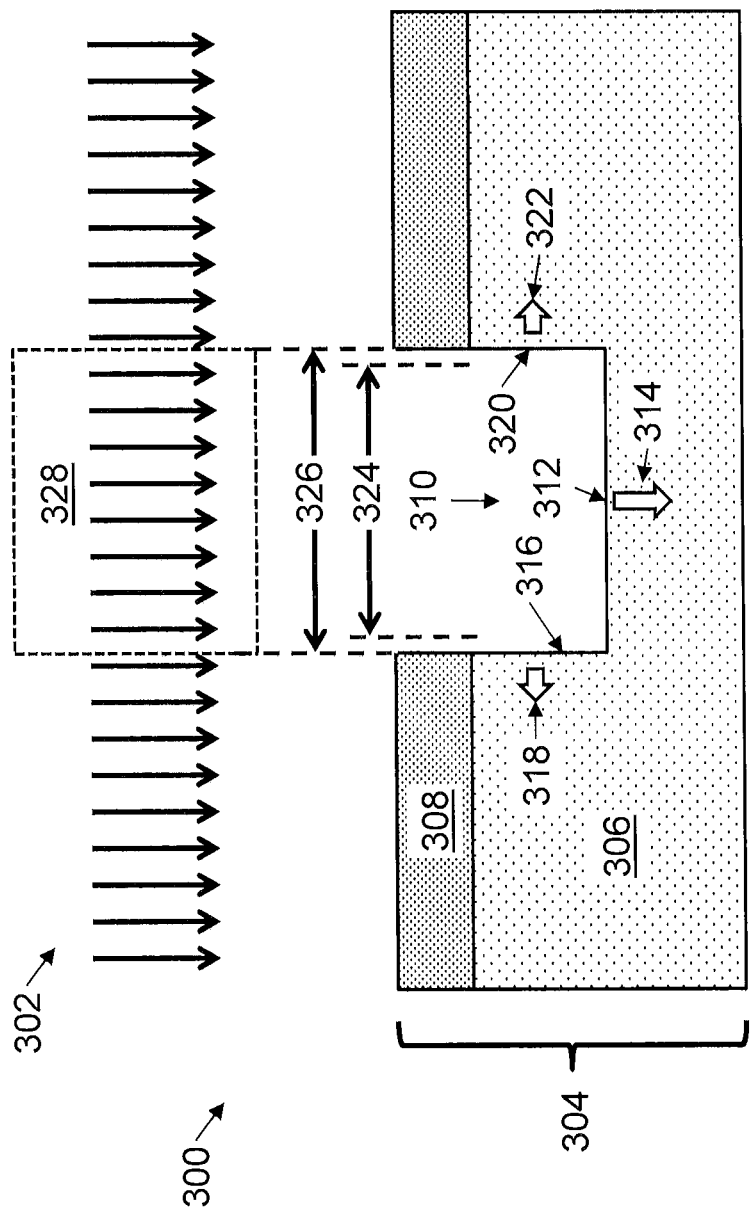
FIG. 5 a cross-sectional diagram of an embodiment of a device feature and associated pattern element during an etch process.

FIG. 5 depicts a cross-sectional diagram of an embodiment of a device feature and associated device pattern element 300 during an etch process. Plasma 302 is provided above substrate 304 comprising substrate material 306 that is covered by a layer of patterning material 308. The patterning material has an opening 310 formed through, for example, resist development. The plasma 302 moves into the opening 310 and interacts with substrate material 306 and the patterning material 308. Opening 310 enlarges downward in a first direction 314 by removal of material from surface 312, and expands laterally in a second direction 318 through removal of material from side 316 and expands laterally in a third direction 322 through removal of material from side 320. The rate of material removal in the first direction 314 may exceed the rate of etching in the second direction 318 and the third direction 322. The opening 310 may have a first width 324 at the start of the etch process, and a second width 326 after the etch process ends. A volume 328 of plasma 302 above the opening 310 may have a plasma density therein that can be used to model an etch process, or the etch bias resulting from an etch process.

A plasma surface concentration applied to a pattern element (trench) during an etch process may be represented by D with a unit such as moles/$\mu m^2$. For purposes of embodiments of etch bias modeling described herein, the plasma surface concentration may be approximated as a constant value to simplify modeling calculations. A pattern element such as opening 310 may have an area A with a unit such as ($\mu m^2$) based on an initial spatial property (such as an initial critical dimension $CD_0$) with a unit such as ($\mu m$) of the pattern element. In an embodiment, first width 324 is an example of an initial spatial property of the pattern element. A number Q (moles) of atoms or molecules of a reactive species of a plasma above the initial area A may be determined as follows:

$$Q = D \times A \quad [1]$$

A further approximation for the modeling process may include treating the number of reactive species in the trench as a constant, such as when the reactive species are in an equilibrium state, where the number of incoming reactive species is equal to the number of exiting reactive species and the number of reactive species that are consumed by etching and/or that bind to an etched surface. In other words, the rate of change of the number of reactive species is set to zero:

$$\frac{dQ}{dt} = 0.$$

Another approximation that may improve the ability to perform the etch bias modeling may involve treating the effect of reactive species in a trench as being similarly effective at lateral material removal at all points on a side of a pattern element. Thus, for a pattern element perimeter L that extends around the area A, the plasma species linear concentration ($C_T$) may be expressed as:

$$C_T = \frac{Q}{L} \quad [2]$$

and the lateral etch rate may be expressed as:

$$\frac{dCD}{dt} = kC_T^n \quad [3]$$

wherein k is a reaction constant, n is the reaction order, and CD is a spatial property (e.g., a dimension) of the pattern element (a trench in this example). Where the pattern element is a recess, the spatial property may be a dimension that traverses an opening of the trench. Where the pattern element is not a recess, the spatial property may be a dimension that traverses material of the pattern element that remains as, or after, material is removed from the substrate.

For simple geometries such as circles, ellipses, and linear trenches, the plasma species linear concentration $C_T$ may be defined as a function of CD as follows:

$$\ln\left(\frac{CD_t}{CD_0}\right) = kt \quad [4]$$

$$CD_t - CD_0 = CD_0 e^{kt} - CD_0 \quad [5]$$

$$\text{etch bias} = CD_0(e^{kt} - 1) \quad [6]$$

wherein $CD_0$ represents the initial spatial property value (e.g., initial dimension), $CD_t$ represents the spatial property at a later etch time t (and thus etch bias can be $CD_t - CD_0$), and k is a reaction constant for the etch process.

Using an equation such as equation [6], the parameter kt can be determined by fitting the etch bias equation to a set of measurement data. In particular, the parameter kt can be determined by fitting against a set of etch bias values determined for various values of $CD_0$ based on data collected from a set of measurement sites (e.g., different evaluation points 116/124) in a device pattern on a substrate as described above. Thus, when parameterized by fitting, this etch bias model is specified for the particular etch process (including its etch time) against which it is fitted.

So, in an embodiment, according to the model of equation [6], an etch bias of a device pattern etched using the etch process for which the model of equation [6] has been parameterized can be determined by merely inputting a particular value of $CD_0$. The etch bias model may be used for different device patterns (using the same patterning process) and/or for different locations of various different pattern elements of a device pattern.

To accommodate a non-simple geometric layout (e.g., a random layout) where $CD_0$ is not readily defined, equation [6] can be reformulated as:

$$\text{etch bias} = k_1 C_{T0}(e^{kt} - 1) \quad [7]$$

wherein t is the etch time, k is a reaction constant for the etch process, $C_{T0}$ is the initial plasma species linear concentration, and $k_1$ is a calibration parameter to be fitted. This is done by recognizing that $CD_0$ is approximately proportional to the initial plasma species linear concentration $C_{T0}$ on the pattern element edge (note above that $C_T$ is effectively $$\frac{D \times A}{L}).$$

So, in embodiments where the $CD_0$ of a pattern element is unknown, or not well defined, an approximation of $CD_0$ with $C_{T0}$ may facilitate the etch bias calculation.

So, to determine $C_{T0}$ for fitting of equation [7] and for subsequent determination of etch bias (since $C_{T0}$ will be the variable in the model effectively in place of $CD_0$ of the model of equation [6]), an ambit can be defined that surrounds the evaluation point corresponding to which an etch bias has been measured (for purposes of parameterization of the model) or corresponding to a location of interest for which an etch bias is desired (for purpose of etch bias calculation using the parameterized model). The ambit effectively delimits the initial plasma specifies linear concentration.

Figure 6:
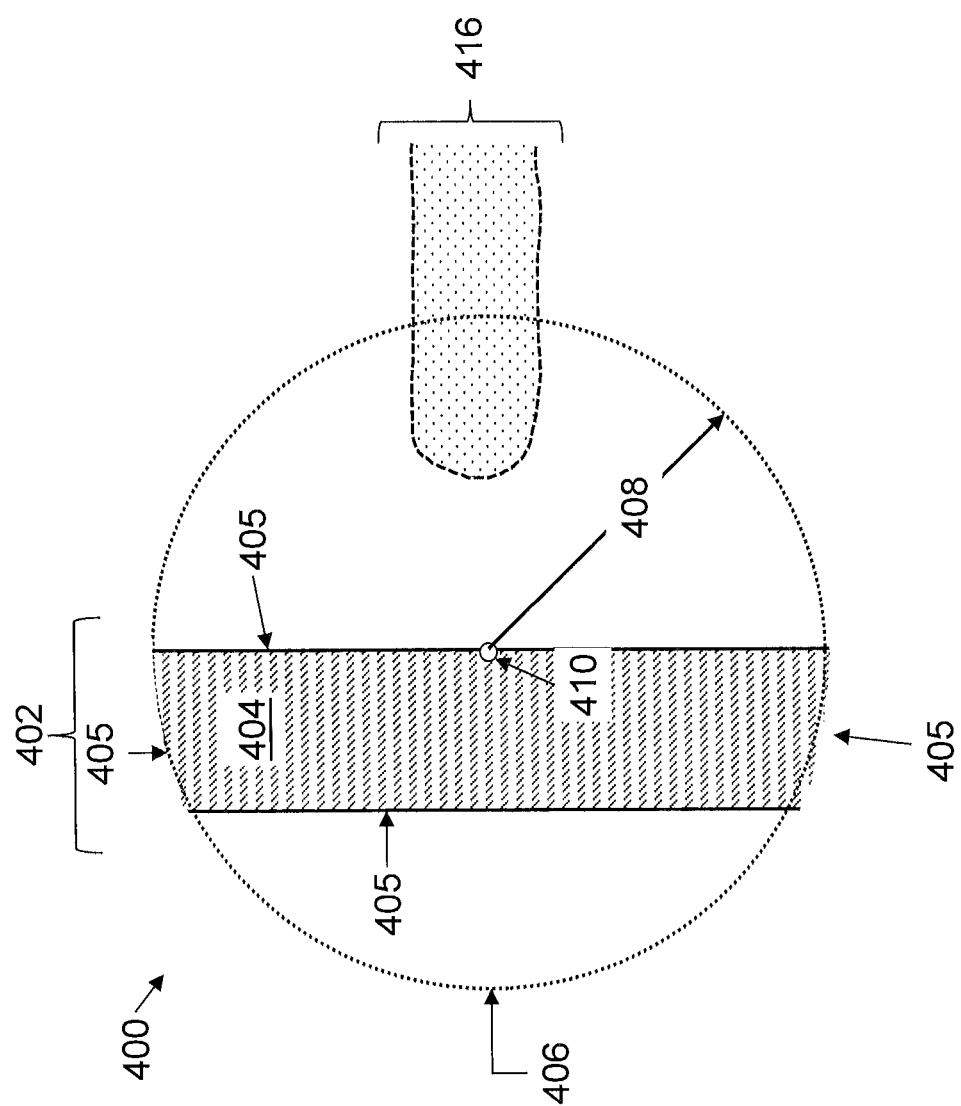
FIG. 6 depicts a schematic diagram of a modeled area of an embodiment of a device.

FIG. 6 depicts a schematic diagram of a modeled area 400 of an embodiment of a device. Modeled area 400 includes a pattern element 402 (a trench) with an area 404 located within an initial area perimeter 405. Pattern element 402 has an evaluation point 410. Evaluation 410 corresponds to the location where an etch bias is determined for parameterization of the model and/or corresponds to the location for which is an etch bias is determined using a parameterized mode. So, to define the initial plasma species linear concentration, an ambit 406 is defined. In an embodiment, the ambit 406 is a radius. In an embodiment, the ambit 406 is defined relative to the evaluation point 410, e.g., evaluation point 410 is at a central portion of the ambit 406. Ambit 406 helps define the extent of the area and perimeter of pattern element 402 (since evaluation point 410 is located on pattern element 402) that will be considered to calculate $C_{T0}$, which is effectively $$\frac{D \times A}{L}.$$

That is, it helps define the area adjoining evaluation point 410. So, as seen in FIG. 6, the applicable area is the shaded area 404, which as seen is delimited by an ambit 406 at opposite ends thereof and delimited by opposite sides of the pattern element 402. As seen in FIG. 6, ambit 408 extends to overlap a second pattern element 416, but that area is not included because it is not connected to pattern element (trench) 402. So, the initial plasma species linear concentration $C_{T0}$ can be calculated using the area and perimeter of the shaded area 404 in combination with the plasma specifies surface concentration in the formula $$\frac{D \times A}{L}.$$

For the purpose of parameterization of the model, initial plasma species linear concentration $C_{T0}$ would be calculated for each etch bias evaluated for fitting. For the purpose of etch bias calculation using a parameterized the model, initial plasma species linear concentration $C_{T0}$ would be calculated for the evaluation point 410 of interest.

So, using an equation such as equation [7], the parameters kt and $k_1$ can be determined by fitting the etch bias equation to a set of measurement data. In particular, the parameters kt and $k_1$ can be determined by fitting against a set of etch bias values determined for various initial plasma species linear concentrations $C_{T0}$ calculated as described above, collected from a set of measurement sites (e.g., different evaluation points 410) in a device pattern on a substrate as described above. Thus, when parameterized by fitting, this etch bias model is specified for the particular etch process against which it is fitted including the etch time and ambit. The ambit size describes how long the etch proximity effects are and so can be decided based on substrate data (e.g., different ambit sizes can be tried to get better fitting with a higher or highest coefficient of determination).

So, in an embodiment, according to the model of equation [7], an etch bias of a device pattern etched using the etch process for which the model of equation [7] has been parameterized can be determined by merely inputting a particular initial plasma species linear concentration $C_{T0}$ (which can be calculated as described using the ambit size of the model).

While the etch bias calculations above have focused on the etch bias contributions from plasma species themselves, the patterning material (e.g., resist or other masking material) itself can affect the nature of the etch bias. Thus, an etch bias calculation may factor in one or more materials of the patterning material that impact the etch bias of the substrate. So, the etch bias contribution of a patterning material itself can be factored in by relating the reaction constant k with one or more patterning material characteristics relating to the etch rate in the lateral direction. So, in an embodiment, the rate constant k of equation [7] may be replaced with a modified form of the Arrhenius equation. By substituting a linear concentration of patterning material $C_R$ for the activation energy Ea of the Arrhenius equation and combining the other factors of the exponent into a term s, a modified form of the Arrhenius equation may be expressed as:

$$k = Ae^{\frac{-C_R}{s}} \quad [8]$$

and the etch bias equation [7] may then be expressed as follows:

$$\text{etch bias} = k_1 C_{T0}\left(e^{Ate^{\frac{-C_R}{s}}} - 1\right) \quad [9]$$

wherein t is the etch time, $C_{T0}$ is the initial plasma species linear concentration (which can be calculated as described above), $k_1$ is a calibration parameter to be fitted, and A is the frequency factor for the reaction.

While $C_{T0}$ relates to the exposed initial etch area of the pattern element being etched, patterning material linear concentration $C_R$ relates to the perimeter area of the patterning material that adjoins the particular evaluation point of the device pattern. That is, an area of patterning material can be specified to determine the patterning material linear concentration $C_R$ corresponding to a point on the perimeter of the pattern element that is being etched. The following figures demonstrate different example techniques to provide a linear concentration of patterning material for the etch bias formula shown above in equation [9].

Figure 7:
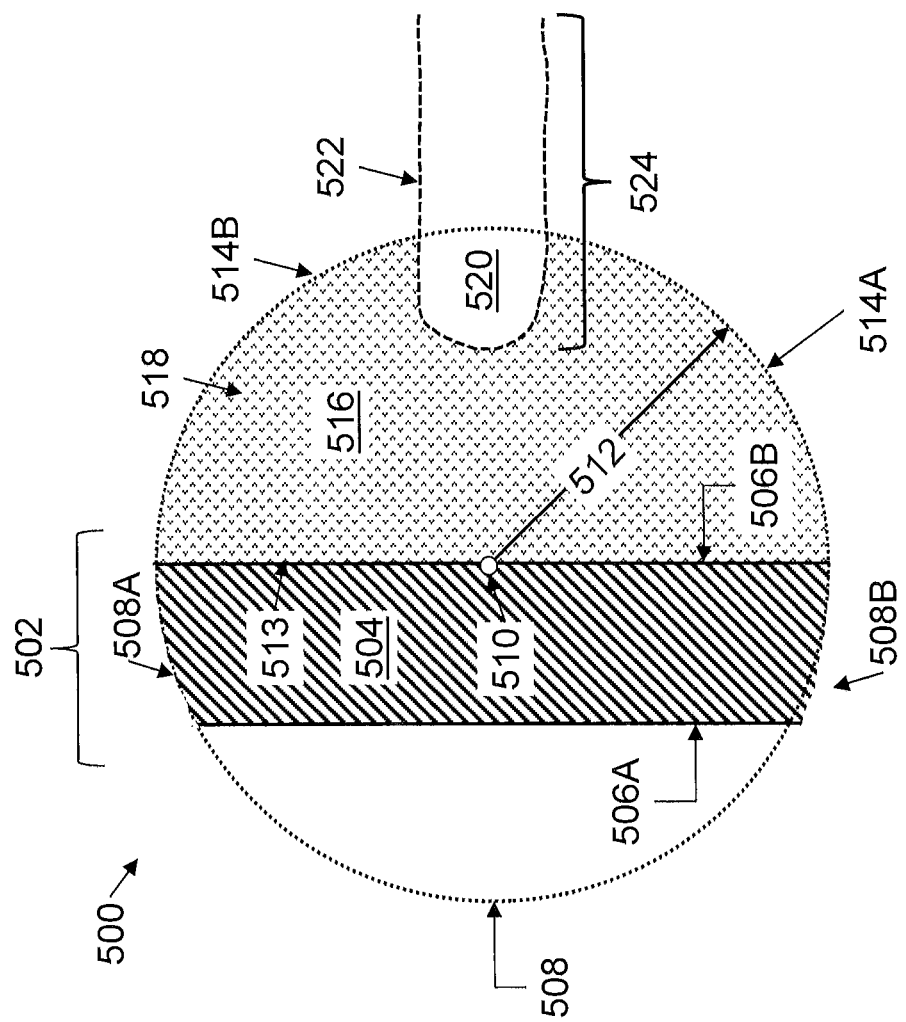
FIG. 7 depicts a schematic diagram of a modeled area of an embodiment of a device.

FIG. 7 depicts a schematic diagram of a modeled area 500 of an embodiment of a device. Modeled area 500 includes a pattern element 502. In this case, pattern element 502 is a trench. In other embodiments, pattern element 502 may be a different type of feature. Modeled area 500 includes an etched area 504 within the sides 506A and 506B of pattern element 502 and within segments 508A and 508B of an ambit 508 located around an evaluation point 510 of the modeled area 502. Ambit 508 may be a circular shape, as shown in FIG. 7, or may be another closed shape such as an ellipse, an oval, a rectilinear shape, or some other shape that encloses a portion of a pattern element and a region of patterning material adjoining the etched area 504 of the pattern element 502. In FIG. 7, ambit 508 has the evaluation point 510 at a central portion of the ambit 508, with a radius 512 extending outward from evaluation point 510 to describe an ambit perimeter.

FIG. 7 shows a patterning material (e.g. resist) area 516 within ambit 508 that may be bounded by a side 506B of the pattern element 502 and perimeter segments 514A and 514B of the ambit 508. Patterning material area 516 may exclude an open area 520 that is within a border 522 of a neighboring pattern element 524 that falls at least partly within the perimeter of the ambit 508. In some embodiments, an ambit 508 may include a plurality of open areas such as open area 520 that are located fully or partly within the perimeter of the ambit 508 and reduce the size of the patterning material area 516 that may be used to calculate the patterning material linear concentration for the patterning material adjoining the evaluation point and thus affecting the etch bias at the evaluation point.

Figure 8:
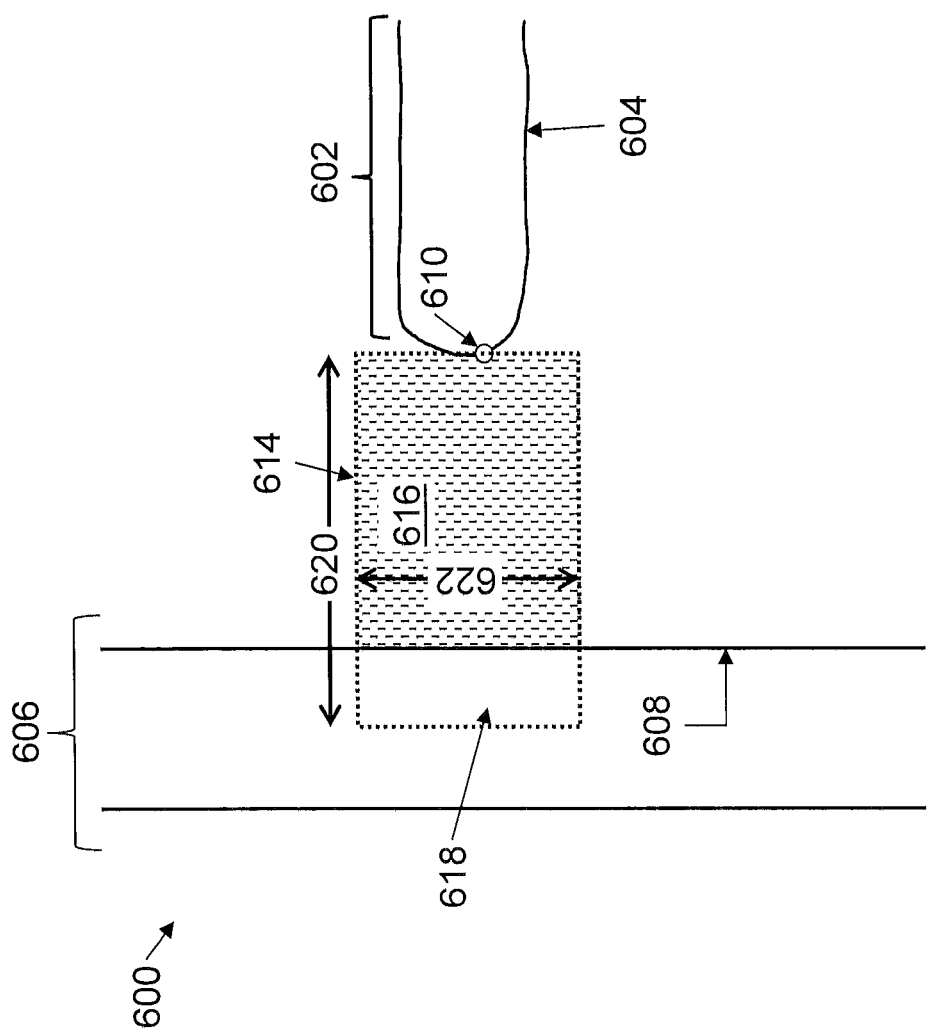
FIG. 8 depicts a schematic diagram of a modeled area of an embodiment of a device.

FIG. 8 depicts a schematic diagram of a modeled area 600 of an embodiment of a device. Modeled area 600 may include a first pattern element 602 with a first sidewall 604, and a second pattern element 606 with a second sidewall 608. An evaluation point 610 is at one end of first pattern element 602. Evaluation point 610 lies at one side of patterning material ambit 614 that extends toward second pattern element 606. Ambit 614 extends a first distance 620 outward from first pattern element 602 and a second distance 622 perpendicular to first distance 622. In an embodiment, the first distance 820 is perpendicular to a side or tangent of the sidewall 604. Ambit 614 may encompass patterning material area 616 and overlap area 618. The overlap area 618 corresponds to the portion of the ambit 614 extending across at least part of another pattern element, such as pattern element 606. So, the patterning material area 616 can be defined as the ambit less the overlap area 618. Ambit 614 may be a rectilinear ambit but could be circular, oval, elliptical, or some other closed shape that encompasses or adjoins at least an evaluation point, such as evaluation point 610 of pattern element 602. In some embodiments, the ambit 614 can be filled entirely with patterning material if the ambit 614 were to extend and not include an overlap area such as overlap area 618 (e.g., if ambit 614 extended from an appropriate different evaluation point on sidewall 604).

So, for area 516 or 616, the patterning material linear concentration $C_R$ can be calculated. It can be calculated using a similar formulation as $C_T$ described above except using a pattern material surface concentration instead of plasma species surface concentration.

Then, using equation [9], the parameters At and $k_1$ can be determined by fitting the etch bias equation to a set of measurement data. In particular, the parameters At and $k_1$ can be determined by fitting against a set of etch bias values determined for various initial plasma species linear concentrations $C_{T0}$ calculated as described above and associated patterning material linear concentrations $C_R$ calculated as described above, collected from a set of measurement sites (e.g., different evaluation points 410, 510, 610) in a device pattern on a substrate as described above. Thus, when parameterized by fitting, this etch bias model is specified for the particular etch process against which it is fitted including the etch time and associated ambits. The ambits can be decided based on substrate data (e.g., different ambit sizes and/or shapes can be tried to get better fitting with a higher or highest coefficient of determination).

So, in an embodiment, according to the model of equation [9], an etch bias of a device pattern etched using the etch process for which the model of equation [9] has been parameterized can be determined by merely inputting a particular initial plasma species linear concentration $C_{T0}$ (which can be calculated as described using the ambit size of the model) and patterning material linear concentrations $C_R$ (which can be calculated as described using the ambit size of the model).

In the above formulations, the patterning material layer materials property is related to the reaction constant. But, it may be that etch bias is a chemical reaction that occurs with the plasma species and the patterning material participating as reactants. Then, etch bias in the lateral direction can be treated as a second order reaction, with the lateral etch rate being proportional to both $C_T$ and $C_R$.

$$\frac{dE}{dt} = kC_T C_R \qquad [10]$$

wherein k is a reaction constant.

It can be approximately assumed that the decrease of $C_T$ equals the increase of $C_R$, or vice versa. So, at time t, the decrease of $C_T$ (and the increase of $C_R$) can be designated as x, then it can be formulated that:

$$\frac{dx}{dt} = k(C_{T0} - x)(C_{R0} + x) \qquad [11]$$

$$\frac{dx}{(C_{T0} - x)(C_{R0} + x)} = k dt \qquad [12]$$

wherein $C_{T0}$ is $C_T$ at time 0 and $C_{R0}$ is $C_R$ at time 0. So, using an initial condition of x=0 at t=0, and integrating the above differential equation yields:

$$\frac{1}{-C_{R0} - C_{T0}} \ln\left(\frac{C_{T0}(C_{R0} + x)}{C_{R0}(C_{T0} - x)}\right) = kt \qquad [13]$$

$$x = C_{T0} - \frac{C_{T0} + C_{R0}}{1 + \frac{C_{R0}}{C_{T0}} e^{-kt(C_{T0} + C_{R0})}} \qquad [14]$$

$$C_T(t) = C_{T0} - x = \frac{C_{T0} + C_{R0}}{1 + \frac{C_{R0}}{C_{T0}} e^{-kt(C_{T0} + C_{R0})}} \qquad [15]$$

$$C_R(t) = C_{R0} + x = (C_{T0} + C_{R0})\left(1 - \frac{1}{1 + \frac{C_{R0}}{C_{T0}} e^{-kt(C_{T0} + C_{R0})}}\right) \qquad [16]$$

wherein $C_T(t)$ is $C_T$ at time t and $C_R(t)$ is $C_R$ at time t. Since, in the two equations above, $C_T$ and $C_R$ are expressed as functions of etch time, the final etch bias can be expressed as:

$$\text{bias} = \Sigma_0^n c_n C_T(t_n) C_R(t_n) \qquad [17]$$

wherein $C_T$ and $C_R$ are evaluated at n time intervals in the etch time, and $t_n$ and $c_n$ are etch rate coefficients. With measurement data, the etch rate coefficients $c_n$ along with other parameters for evaluating $C_T$ and $C_R$ can be calibrated to have an etch bias model.

Thus, there is provided an etch bias model based on simplified chemical dynamics that aims at predicting/simulating lateral CD evolvement due to pattern proximity effects. Etch bias is ascribed to plasma species in a trench and optionally etched patterning material in the neighborhood.

A concept in the model is that the plasma species uniformly act on the edges to induce an etch bias. An assumption that the plasma species maintain an equilibration state may not be true due to the oscillatory nature of the strong RF (radio frequency) electromagnetic field used to initiate plasma. The failure of such an assumption may lead to inaccurate etch time estimation. But, with focus on a lateral spatial property (e.g., CD) change and the time factor in the model is a fitting parameter, the failure of such an assumption does not significantly affect the effectiveness of the model.

Regarding etch bias contribution from etched patterning material, several approaches have been discussed above. The contribution of the patterning material to etch bias can be treated as an exponential factor in the reaction constant just like the classical Arrhenius equation governing reactions. Additionally or alternatively, the patterning material can be treated as one reactant in a second order reaction scheme.

So, a physical approach to modelling etch bias for etch processes has been described herein. The approach is capable of simulating etch bias for various layouts with potential full-chip applications. In an embodiment, it assumes that plasma chemical species in the trenches are maintained in an equilibrium state and the plasma species act on edges uniformly to induce etch bias. For complex layouts, methods were provided to evaluate edge loadings of plasma species. This evaluation is based on local neighboring trench area and edge length. In addition, the impact of patterning material on etch bias can be incorporated in an etch bias model in several ways. One way to do so is to treat the impact as an exponential factor in the reaction constant. A further way treats the patterning material as a reactant (together with plasma species) in a second order reaction scheme wherein the evolvement of $C_T$ and $C_R$ as a function of time is derived and the etch bias is a time integral of $C_T$ and $C_R$ over time. A set of calibration data are used to calibrate the etch bias model with this physical approach.

In an embodiment, there is provided a method, comprising: determining, by a hardware computer, an etch bias for a pattern to be etched using an etch step of a patterning process based on an etch bias model, the etch bias model comprising a formula including a variable associated with a spatial property of the pattern or with an etch plasma species concentration of the etch step, and including a mathematical term comprising a natural exponential function to the power of a parameter that is fitted or based on an etch time of the etch step; and adjusting the patterning process based on the determined etch bias. In an embodiment, the parameter of the exponential function is fitted or based on the etch time and a reaction constant for the etch step. In an embodiment, the variable comprises the spatial property of the pattern and the spatial property of the pattern is an initial pattern element dimension. In an embodiment, n the variable comprises the spatial property of the pattern and the formula comprises the variable multiplied by the mathematical term. In an embodiment, the variable comprises the spatial property of the pattern and the formula comprises a form of $CD_0(e^{kt}-1)$, where $CD_0$ is the variable and corresponds to a dimension of the pattern and kt is the parameter that is fitted for the etch time t of the etch step and a reaction constant k for the etch step. In an embodiment, the variable comprises the etch plasma species concentration and the formula further comprises a calibration parameter. In an embodiment, the variable comprises the etch plasma species concentration and the formula comprises the variable multiplied by the mathematical term. In an embodiment, the variable comprises the etch plasma species concentration wherein the formula comprises a form of $k_1 C_{T0}(e^{kt}-1)$, wherein $k_1$ is a calibration parameter, $C_{T0}$ is the variable and corresponds to the etch plasma species concentration, and kt is the parameter that is fitted for the etch time t of the etch step and a reaction constant k for the etch step. In an embodiment, the variable comprises the etch plasma species concentration and the etch plasma species concentration is defined for an etched area of the pattern within an etched material ambit surrounding an evaluation point on the pattern, wherein the etch plasma species concentration is proportional to the etched area. In an embodiment, the etched material ambit is a circular ambit centered on the evaluation point, the evaluation point being located at an interface between the etched area and a patterning material area of the substrate. In an embodiment, the variable comprises the etch plasma species concentration and the formula contains a modified form of the Arrhenius equation incorporated in the power of the exponential function. In an embodiment, the variable comprises the etch plasma species concentration and the formula incorporates a patterning material concentration in the power of the exponential function. In an embodiment, the variable comprises the etch plasma species concentration and wherein the formula has a form comprising $$k_1 C_{T0}\left(e^{Ate^{\frac{-CR}{s}}} - 1\right),$$

where $k_1$ is a calibration parameter, $C_{T0}$ is the variable and corresponds to the etch plasma species concentration, $C_R$ is a patterning material concentration, At is the parameter that is fitted for the etch time t of the etch step and a frequency factor A for the reaction of the etch step, and s is a constant for the etch step. In an embodiment, the patterning material concentration is defined for a patterning material area of the pattern adjacent an evaluation point on the pattern. In an embodiment, the patterning material ambit is rectilinear and the patterning material ambit adjoins or overlays the evaluation point or is circular and surrounds the evaluation point. In an embodiment, the etch plasma species concentration is defined for an etched area of the pattern within an etched material ambit surrounding an evaluation point on the pattern, wherein the etch plasma species concentration is proportional to the etched area. In an embodiment, the method further comprises: collecting, at each of a plurality of sites in a pattern, a value of a spatial property of the pattern; and fitting, by a hardware computing device and using the values of the spatial property, the formula to generate the parameter. In an embodiment, adjusting the patterning process comprises adjusting a border of a region of the patterning device according to the calculated etch bias. In an embodiment, the region of the patterning device modifies radiation that strikes the patterning device. In an embodiment, the pattern is a device pattern.

In an embodiment, there is provided a method, comprising: determining, by a hardware computer, an etch bias for a pattern to be etched using an etch step of a patterning process based on an etch bias model, the etch bias model comprising a function of an etch plasma species concentration and a patterning material concentration; and adjusting the patterning process based on the determined etch bias.

In an embodiment, the function comprises the etch plasma species concentration multiplied with the patterning material concentration. In an embodiment, the function comprises a summation of the etch plasma species concentration and the patterning material concentration for a certain number of time intervals of an etch time. In an embodiment, the etch model comprises a mathematical term comprising a natural exponential function to the power of a parameter that is fitted or based on an etch time of the etch step. In an embodiment, the etch bias model has a form comprising $\Sigma_0^n c_n C_T(t_n) C_R(t_n)$, wherein $C_T$ corresponds to the etch plasma species concentration and is evaluated at n number of time intervals in the etch time, $C_R$ corresponds to the patterning material concentration and is evaluated at n number of time intervals in the etch time, and $t_n$ and $c_n$ are etch rate coefficients.

As will be appreciated by one of ordinary skill in the art, the present techniques may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (e.g. EPROM or Flash memory), an optical fiber, a portable compact disc read-only memory CDROM, an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency RF, etc., or any suitable combination thereof.

Computer program code for carrying out operations for aspects of the present application may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network LAN or a wide area network WAN, or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing one or more of the functions/acts specified herein.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Figure 9:
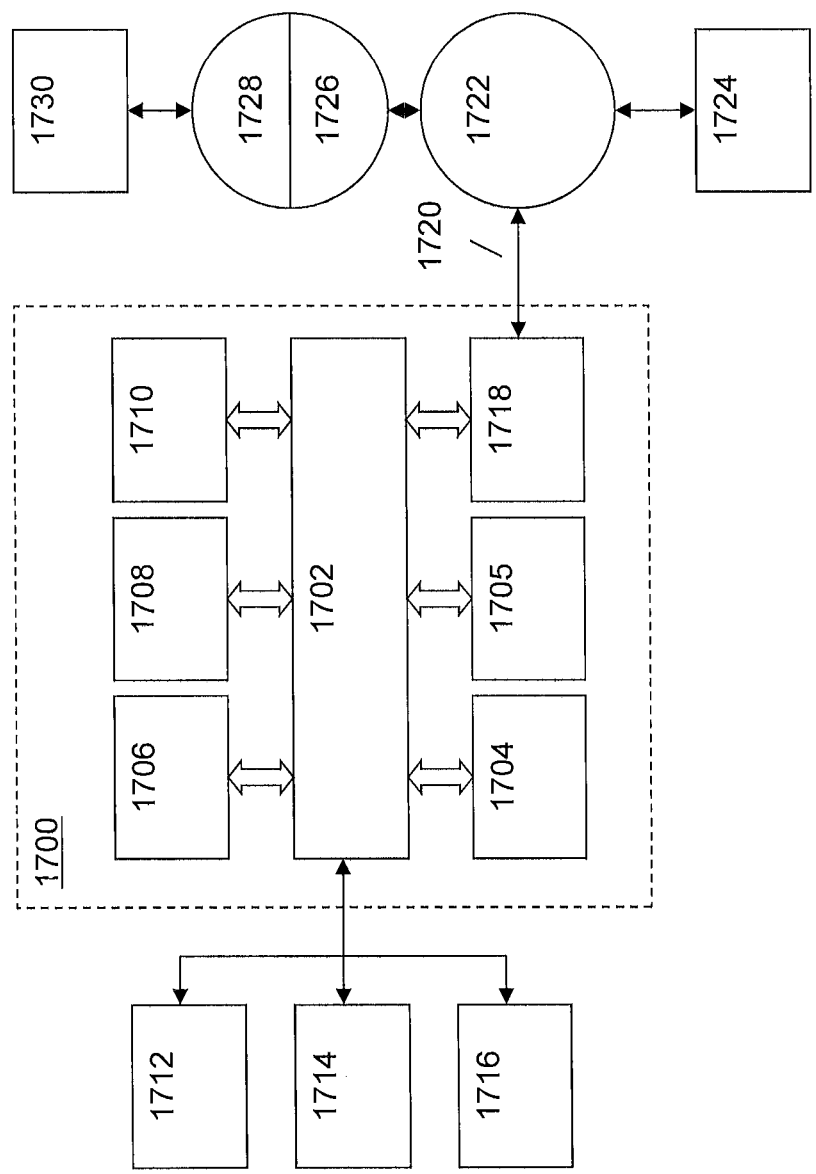
FIG. 9 depicts a block diagram that illustrates an embodiment of a computer system.

FIG. 9 shows a block diagram that illustrates an embodiment of a computer system 1700 which can assist in implementing any of the methods and flows disclosed herein. Computer system 1700 includes a bus 1702 or other communication mechanism for communicating information, and a processor 1704 (or multiple processors 1704 and 1705) coupled with bus 1702 for processing information. Computer system 1700 also includes a main memory 1706, such as a random access memory RAM or other dynamic storage device, coupled to bus 1702 for storing information and instructions to be executed by processor 1704. Main memory 1806 also may be used for storing temporary variables or other intermediate information during execution of instructions to be executed by processor 1704. Computer system 1700 further includes a read only memory ROM 1708 or other static storage device coupled to bus 1702 for storing static information and instructions for processor 1704. A storage device 1710, such as a magnetic disk or optical disk, is provided and coupled to bus 1702 for storing information and instructions.

Computer system 1700 may be coupled via bus 1702 to a display 1712, such as a cathode ray tube (CRT) or flat panel or touch panel display for displaying information to a computer user. An input device 1714, including alphanumeric and other keys, is coupled to bus 1702 for communicating information and command selections to processor 1704. Another type of user input device is cursor control 1716, such as a mouse, a trackball, or cursor direction keys for communicating direction information and command selections to processor 1704 and for controlling cursor movement on display 1712. This input device typically has two degrees of freedom in two axes, a first axis (e.g. x) and a second axis (e.g. y), that allows the device to specify positions in a plane. A touch panel (screen) display may also be used as an input device.

According to one embodiment, portions of a process described herein may be performed by computer system 1700 in response to processor 1704 executing one or more sequences of one or more instructions contained in main memory 1706. Such instructions may be read into main memory 1706 from another computer-readable medium, such as storage device 1710. Execution of the sequences of instructions contained in main memory 1706 causes processor 1704 to perform the process steps described herein. One or more processors in a multi-processing arrangement may also be employed to execute the sequences of instructions contained in main memory 1706. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1704 for execution. Such a medium may take many forms, including but not limited to, non-volatile media, volatile media, and transmission media. Non-volatile media include, for example, optical or magnetic disks, such as storage device 1710. Volatile media include dynamic memory, such as main memory 1706. Transmission media include coaxial cables, copper wire and fiber optics, including the wires that comprise bus 1702. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1704 for execution. For example, the instructions may initially be borne on a magnetic disk of a remote computer. The remote computer can load the instructions into its dynamic memory and send the instructions over a telephone line using a modem. A modem local to computer system 1700 can receive the data on the telephone line and use an infrared transmitter to convert the data to an infrared signal. An infrared detector coupled to bus 1702 can receive the data carried in the infrared signal and place the data on bus 1702. Bus 1702 carries the data to main memory 1706, from which processor 1704 retrieves and executes the instructions. The instructions received by main memory 1706 may optionally be stored on storage device 1710 either before or after execution by processor 1704.

Computer system 1700 may also include a communication interface 1718 coupled to bus 1702. Communication interface 1718 provides a two-way data communication coupling to a network link 1720 that is connected to a local network 1722. For example, communication interface 1718 may be an integrated services digital network ISDN card or a modem to provide a data communication connection to a corresponding type of telephone line. As another example, communication interface 1718 may be a local area network LAN card to provide a data communication connection to a compatible LAN. Wireless links may also be implemented. In any such implementation, communication interface 1718 sends and receives electrical, electromagnetic or optical signals that carry digital data streams representing various types of information.

Network link 1720 typically provides data communication through one or more networks to other data devices. For example, network link 1720 may provide a connection through local network 1722 to a host computer 1724 or to data equipment operated by an Internet Service Provider ISP 1726. ISP 1726 in turn provides data communication services through the worldwide packet data communication network, now commonly referred to as the "Internet" 1728. Local network 1722 and Internet 1728 both use electrical, electromagnetic or optical signals that carry digital data streams. The signals through the various networks and the signals on network link 1720 and through communication interface 1718, which carry the digital data to and from computer system 1700, are exemplary forms of carrier waves transporting the information.

Computer system 1700 can send messages and receive data, including program code, through the network(s), network link 1720, and communication interface 1718. In the Internet example, a server 1730 might transmit a requested code for an application program through Internet 1728, ISP 1726, local network 1722 and communication interface 1718. One such downloaded application may provide for a method or portion thereof as described herein, for example. The received code may be executed by processor 1704 as it is received, and/or stored in storage device 1710, or other non-volatile storage for later execution. In this manner, computer system 1700 may obtain application code in the form of a carrier wave.

The embodiments may further be described using the following clauses:

1. A method, comprising:
   determining, by a hardware computer, an etch bias for a pattern to be etched using an etch step of a patterning process based on an etch bias model, the etch bias model comprising a formula including a variable associated with a spatial property of the pattern or with an etch plasma species concentration of the etch step, and including a mathematical term comprising a natural exponential function to the power of a parameter that is fitted or based on an etch time of the etch step; and
   adjusting the patterning process based on the determined etch bias.

2. The method of clause 1, wherein the parameter of the exponential function is fitted or based on the etch time and a reaction constant for the etch step.
3. The method of clause 1 or clause 2, wherein the variable comprises the spatial property of the pattern and the spatial property of the pattern is an initial pattern element dimension.
4. The method of any of clauses 1-3, wherein the variable comprises the spatial property of the pattern and the formula comprises the variable multiplied by the mathematical term.
5. The method of any of clauses 1-4, wherein the variable comprises the spatial property of the pattern and the formula comprises a form of $CD_0(e^{kt}-1)$, where $CD_0$ is the variable and corresponds to a dimension of the pattern and kt is the parameter that is fitted for the etch time t of the etch step and a reaction constant k for the etch step.
6. The method of any of clauses 1-5, wherein the variable comprises the etch plasma species concentration and the formula further comprises a calibration parameter.
7. The method of any of clauses 1-6, wherein the variable comprises the etch plasma species concentration and the formula comprises the variable multiplied by the mathematical term.
8. The method of any of clauses 1-7, wherein the variable comprises the etch plasma species concentration wherein the formula comprises a form of $k_1 C_{T0}(e^{kt}-1)$, wherein $k_1$ is a calibration parameter, $C_{T0}$ is the variable and corresponds to the etch plasma species concentration, and kt is the parameter that is fitted for the etch time t of the etch step and a reaction constant k for the etch step.
9. The method of any of clauses 1-8, wherein the variable comprises the etch plasma species concentration and the etch plasma species concentration is defined for an etched area of the pattern within an etched material ambit surrounding an evaluation point on the pattern, wherein the etch plasma species concentration is proportional to the etched area.
10. The method of clause 9, wherein the etched material ambit is a circular ambit centered on the evaluation point, the evaluation point being located at an interface between the etched area and a patterning material area of the substrate.
11. The method of any of clauses 1-10, wherein the variable comprises the etch plasma species concentration and the formula contains a modified form of the Arrhenius equation incorporated in the power of the exponential function.
12. The method of any of clauses 1-11, wherein the variable comprises the etch plasma species concentration and the formula incorporates a patterning material concentration in the power of the exponential function.
13. The method of any of clauses 1-12, wherein the variable comprises the etch plasma species concentration and wherein the formula has a form comprising $$k_1 C_{T0}\left(e^{Ate^{\frac{-CR}{s}}} - 1\right),$$

where $k_1$ is a calibration parameter, $C_{T0}$ is the variable and corresponds to the etch plasma species concentration, $C_R$ is a patterning material concentration, At is the parameter that is fitted for the etch time t of the etch step and a frequency factor A for the reaction of the etch step, and s is a constant for the etch step.

14. The method of clause 12 or clause 13, wherein the patterning material concentration is defined for a patterning material area of the pattern adjacent an evaluation point on the pattern.
15. The method of clause 14, wherein the patterning material ambit is rectilinear and the patterning material ambit adjoins or overlays the evaluation point or is circular and surrounds the evaluation point.
16. The method of any of clauses 12-15, wherein the etch plasma species concentration is defined for an etched area of the pattern within an etched material ambit surrounding an evaluation point on the pattern, wherein the etch plasma species concentration is proportional to the etched area.
17. The method of any of clauses 1-16, further comprising:
    collecting, at each of a plurality of sites in a pattern, a value of a spatial property of the pattern; and
    fitting, by a hardware computing device and using the values of the spatial property, the formula to generate the parameter.
18. The method of any of clauses 1-17, wherein adjusting the patterning process comprises adjusting a border of a region of the patterning device according to the calculated etch bias.
19. The method of clause 18, wherein the region of the patterning device modifies radiation that strikes the patterning device.
20. The method of any of clauses 1-19, wherein the pattern is a device pattern.
21. A method, comprising:
    determining, by a hardware computer, an etch bias for a pattern to be etched using an etch step of a patterning process based on an etch bias model, the etch bias model comprising a function of an etch plasma species concentration and a patterning material concentration; and
    adjusting the patterning process based on the determined etch bias.
22. The method of clause 21, wherein the function comprises the etch plasma species concentration multiplied with the patterning material concentration.
23. The method of clause 21 or clause 22, wherein the function comprises a summation of the etch plasma species concentration and the patterning material concentration for a certain number of time intervals of an etch time.
24. The method of any of clauses 21-23, wherein the etch model comprises a mathematical term comprising a natural exponential function to the power of a parameter that is fitted or based on an etch time of the etch step.
25. The method of any of clauses 21-24, wherein the etch bias model has a form comprising $\Sigma_0^n c_n C_T(t_n) C_R(t_n)$, wherein $C_T$ corresponds to the etch plasma species concentration and is evaluated at n number of time intervals in the etch time, $C_R$ corresponds to the patterning material concentration and is evaluated at n number of time intervals in the etch time, and $t_n$ and $c_n$ are etch rate coefficients.
26. A computer program product comprising a non-transitory computer readable medium having instructions recorded thereon, the instructions when executed by a computer implementing the method of any of clauses 1-25.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle"/"mask", "wafer" or "die" in this text should be considered as interchangeable with the more general terms "patterning device", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

While the concepts disclosed herein may be used with systems and methods for imaging on a substrate such as a silicon wafer, it shall be understood that the disclosed concepts may be used with any type of lithographic systems, e.g., those used for imaging on substrates other than silicon wafers.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The description of the present application has been presented for purposes of illustration and description, and is not intended to be exhaustive or limiting of the invention in the form disclosed. Many modifications and variations will be apparent to those of ordinary skill in the art. Thus, it will be apparent to one skilled in the art that modifications may be made as described without departing from the scope of the claims set out below.

The invention claimed is:

1. A method, comprising:
determining, by a hardware computer and based on an etch bias model, an etch bias for a pattern to be etched using an etch step of a patterning process, the etch bias model comprising a formula including a variable associated with a spatial property of the pattern or with an etch plasma species concentration of the etch step, and including a mathematical term comprising a natural exponential function to the power of a parameter that is fitted or based on an etch time of the etch step; and
adjusting the patterning process based on the determined etch bias.

2. The method of claim 1, wherein the parameter of the exponential function is fitted or based on the etch time and a reaction constant for the etch step.

3. The method of claim 1, wherein the variable comprises the spatial property of the pattern and the spatial property of the pattern is an initial pattern element dimension.

4. The method of claim 1, wherein the variable comprises the spatial property of the pattern and the formula comprises the variable multiplied by the mathematical term.

5. The method of claim 1, wherein the variable comprises the spatial property of the pattern and the formula comprises a form of $CD_0(e^{kt}-1)$, where $CD_0$ is the variable and corresponds to a dimension of the pattern and kt is the parameter that is fitted for the etch time t of the etch step, wherein k is a reaction constant for the etch step.

6. The method of claim 1, wherein the variable comprises the etch plasma species concentration and the formula further comprises a calibration parameter.

7. The method of claim 1, wherein the variable comprises the etch plasma species concentration and the formula comprises the variable multiplied by the mathematical term.

8. The method of claim 1, wherein the variable comprises the etch plasma species concentration wherein the formula comprises a form of $k_1 C_{T0}(e^{kt}-1)$, wherein $k_1$ is a calibration parameter, $C_{T0}$ is the variable and corresponds to the etch plasma species concentration, and kt is the parameter that is fitted for the etch time t of the etch step, wherein k is a reaction constant for the etch step.

9. The method of claim 1, wherein the variable comprises the etch plasma species concentration and the etch plasma species concentration is defined for an etched area of the pattern within an etched material ambit surrounding an evaluation point on the pattern, wherein the etch plasma species concentration is proportional to the etched area.

10. The method of claim 1, wherein the variable comprises the etch plasma species concentration and the formula contains a modified form of the Arrhenius equation incorporated in the power of the exponential function.

11. The method of claim 1, wherein the variable comprises the etch plasma species concentration and the formula incorporates a patterning material concentration in the power of the exponential function.

12. The method of claim 1, wherein the variable comprises the etch plasma species concentration and wherein the formula has a form comprising $$k_1 C_{T0} \left( e^{Ate^{\frac{-CR}{s}}} - 1 \right)$$

where $k_1$ is a calibration parameter, $C_{T0}$ is the variable and corresponds to the etch plasma species concentration, $C_R$ is a patterning material concentration, At is the parameter that is fitted for the etch time t of the etch step, wherein A is a frequency factor for the reaction of the etch step and s is a constant for the etch step.

13. The method of claim 1, further comprising:
collecting, at each of a plurality of sites in a pattern, a value of a spatial property of the pattern; and
fitting, by a hardware computing device and using the values of the spatial property, the formula to generate the parameter.

14. The method of claim 1, wherein adjusting the patterning process comprises adjusting a border of a region of the patterning device according to the calculated etch bias.

15. A computer program product comprising a non-transitory computer readable medium having instructions therein, the instructions, upon execution by a computer system, configured to cause the computer system to at least:
determine, based on an etch bias model, an etch bias for a pattern to be etched using an etch step of a patterning process, the etch bias model comprising a formula including a variable associated with a spatial property of the pattern or with an etch plasma species concentration of the etch step, and including a mathematical term comprising a natural exponential function to the power of a parameter that is fitted or based on an etch time of the etch step; and
adjust the patterning process based on the determined etch bias.

16. The computer program product of claim 15, wherein the parameter of the exponential function is fitted or based on the etch time and a reaction constant for the etch step.

17. The computer program product of claim 15, wherein the variable comprises the spatial property of the pattern and the spatial property of the pattern is an initial pattern element dimension.

18. The computer program product of claim 15, wherein the variable comprises the spatial property of the pattern and the formula comprises the variable multiplied by the mathematical term.

19. A method, comprising:
determining, by a hardware computer and based on an etch bias model, an etch bias for a pattern to be etched using an etch step of a patterning process, the etch bias model comprising a function of an etch plasma species spatial concentration and of a patterning material concentration in an exponent in, or of, the function; and
adjusting the patterning process based on the determined etch bias.

20. A computer program product comprising a non-transitory computer readable medium having instructions therein, the instructions, upon execution by a computer system, configured to cause the computer system to at least:
determine, based on an etch bias model, an etch bias for a pattern to be etched using an etch step of a patterning process, the etch bias model comprising a function of an etch plasma species spatial concentration and of a patterning material concentration in an exponent in, or of, the function; and
adjust the patterning process based on the determined etch bias.

* * * * *